United States Patent [19]
Stikvoort

[11] Patent Number: 5,764,171
[45] Date of Patent: Jun. 9, 1998

[54] QUADRATURE SIGNAL CONVERSION DEVICE

[75] Inventor: Eduard F. Stikvoort, Eindhoven, Netherlands

[73] Assignee: U.S. Philips Corporation, New York, N.Y.

[21] Appl. No.: 626,530

[22] Filed: Apr. 2, 1996

[30] Foreign Application Priority Data

Apr. 3, 1995 [EP] European Pat. Off. ............ 95200840

[51] Int. Cl.$^6$ ............................................. H03M 1/08
[52] U.S. Cl. ...................... 341/143; 375/316; 327/215
[58] Field of Search ............................ 341/143, 155; 375/316; 327/215

[56] References Cited

U.S. PATENT DOCUMENTS 4,468,790  8/1984  Hofelt ........................ 375/30
5,442,353  8/1995  Jackson ....................... 341/143

FOREIGN PATENT DOCUMENTS 2233518  1/1991  United Kingdom ............ H03M 3/02

Primary Examiner—Jeffrey A. Gaffin
Assistant Examiner—Peguy JeanPierre
Attorney, Agent, or Firm—Arthur G. Schaier

[57] ABSTRACT

A receiver including two sigma delta modulators used to convert a pair of analog quadrature signals into digital quadrature signals. In such sigma delta modulators the quantization noise is shifted into a frequency region in which no signal is present. A cross coupling between the filters is provided to improve the noise reduction without increasing the order of the filters. By providing the cross coupling, it is possible to obtain complex poles and zeros in the noise transfer function which do not have to appear in complex conjugate pairs which results in an increase of the noise suppression in a specified frequency range.

12 Claims, 3 Drawing Sheets

5,764,171

QUADRATURE SIGNAL CONVERSION DEVICE

BACKGROUND OF THE INVENTION

1. Field of the Invention

The invention is related to a receiver comprising a phase shifter for deriving from an input signal at least a first signal and a second signal having a predetermined phase relationship, a first converter for converting the first signal into a first converted signal, a second converter for converting the second signal into a second converted signal, the first converter and the second converter comprising a combiner for combining the signal to be converted and a feedback signal, and a cascade arrangement of a filter and a quantiser to derive the feedback signal from the output signal of the combiner. The invention is also related to a transmitter and a signal conversion device.

2. Description of the Related Art

A receiver known in the prior art is described in UK Patent No. 2 233 518 A.

Such receivers can be used in mobile radio systems, for reception of broadcast signals and e.g. in microwave radio links. In known receivers a first and a second signal are derived from an input signal. The first signal and the second signal have a predetermined phase relationship, in most cases a phase shift of 90°. Such signals are called quadrature signals, and receivers using them are called quadrature receivers. Use of quadrature signals results in the possibility to achieve different processing of both sidebands of the input signal. That is, it is possible to remove one of the sidebands by the appropriate combining of the first signal and the second signal.

The first signal is derived from the input signal by mixing the input signal with an oscillator signal proportional to $\sin(\omega_0 t)$ and the second signal is derived from the input signal by mixing the input signal with an oscillator signal proportional to $\cos(\omega_0 t)$. The first signal and the second signal are converted into digital signals by a corresponding analog to digital converter.

If the input signal has a large dynamic range (e.g. 100 dB), very heavy requirements have to be fulfilled by the oscillator, the mixers and the analog to digital converters. To meet these specifications, the analog to digital converters in the receiver described in UK Patent No. 2,233,518 use the principle of (sigma) delta modulation. In such analog to digital converters, the input signal to be converted is applied to a first input of the combining circuit which combines the input signal with a feedback signal. The feedback signal is obtained by using a cascade connection of a filter and a quantiser.

There exist several useful configurations of the filter and quantiser. A first possibility is that the output signal of the combining circuit is applied as an input signal for the quantiser and the output signal of the quantiser is the input signal of the filter. The output signal of the filter then constitutes the feedback signal, and the converted signal is the output signal of the quantiser. Such a converter is called a delta modulator.

A problem with such a delta modulator is that it suffers of slope overload which occurs if the input signal changes too rapidly. This can be avoided by filtering the output signal of the combining circuit instead of the output signal of the quantiser. Such a configuration is called a sigma-delta modulator.

In a third configuration, called a noise shaper, the feedback signal is derived from the quantisation error by a filter. This quantisation error is equal to the difference between the input signal and the output signal of the quantiser.

In all three cases the transfer function of the filter is chosen to shift the quantisation error into a frequency range outside the frequency range of the desired signal. In general the filter has a low pass transfer function.

The amount of quantisation noise suppression in the desired frequency range depends on the cut off frequency of the filter, the order of the filter and the sampling frequency of the quantiser. In a number of cases the sampling frequency of the quantiser is fixed by the desired sampling frequency of the output signal or by the maximum obtainable speed of the quantiser. The cut off frequency of the filter is often fixed by the bandwidth of the signal to be converted. In such a situation the amount of noise suppression dictates the order of the filter.

The noise suppression cannot be increased at will, because an increase of in noise suppression will result in increasing stability problems of the conversion device.

SUMMARY OF THE INVENTION

The object of the invention is to provide a conversion device according to the preamble in which an increased quantisation noise suppression can be obtained without increasing the stability problems.

Therefore the receiver according to the invention comprises a first coupler for applying a signal derived from the output signal of the combiner in a first converter to a filter in a second converter and a second coupler for applying a signal derived from the output signal of the combiner in the second converter to the filter in the first converter.

By coupling a signal derived from the output signal of the combiner in the first converter to the filter in the second converter and vice versa, it is possible to obtain a noise transfer function $H(\theta)$ in the fundamental interval that is not symmetrical around $\theta=0$. This asymmetry can be exploited to obtain extra quantisation noise suppression in a desired range of $\theta$ at the cost of quantisation noise suppression in a unimportant range of $\theta$.

A further aspect of the invention is related to a transmitter for deriving a signal to be transmitted from at least a first signal and a second signal having a predetermined phase relationship, the transmitter comprising a first converter for converting the first signal into a first converted signal, a second converter for converting the second signal into a second converted signal, the first converter and the second converter comprising a combiner for combining the signal to be converted and a feedback signal, and a cascade arrangement of a filter and a quantiser to derive the feedback signal from the output signal of the combiner, the transmitter further comprising a first coupler for applying a signal derived from the output signal of the combiner in the first converter to the filter in the second converter and a second coupler for applying a signal derived from the output signal of the combiner in the second converter to the filter in the first converter, and further comprising a further combiner means for combining the first converted signal and the second converted signal into a combined signal.

The basic principle of the invention can also be used in a transmitter. It enables the construction of a digital to analog converter using a sigma delta modulator having improved quantisation noise suppression at a desired frequency.

BRIEF DESCRIPTION OF THE DRAWINGS

The use of signals having a predetermined phase shift of 90° results in an easy implementation, because signals with a phase shift of 90° can be easily generated.

The invention will now be explained with reference to the drawings, in which.

DESCRIPTION OF THE PREFERRED EMBODIMENTS

Figure 1:
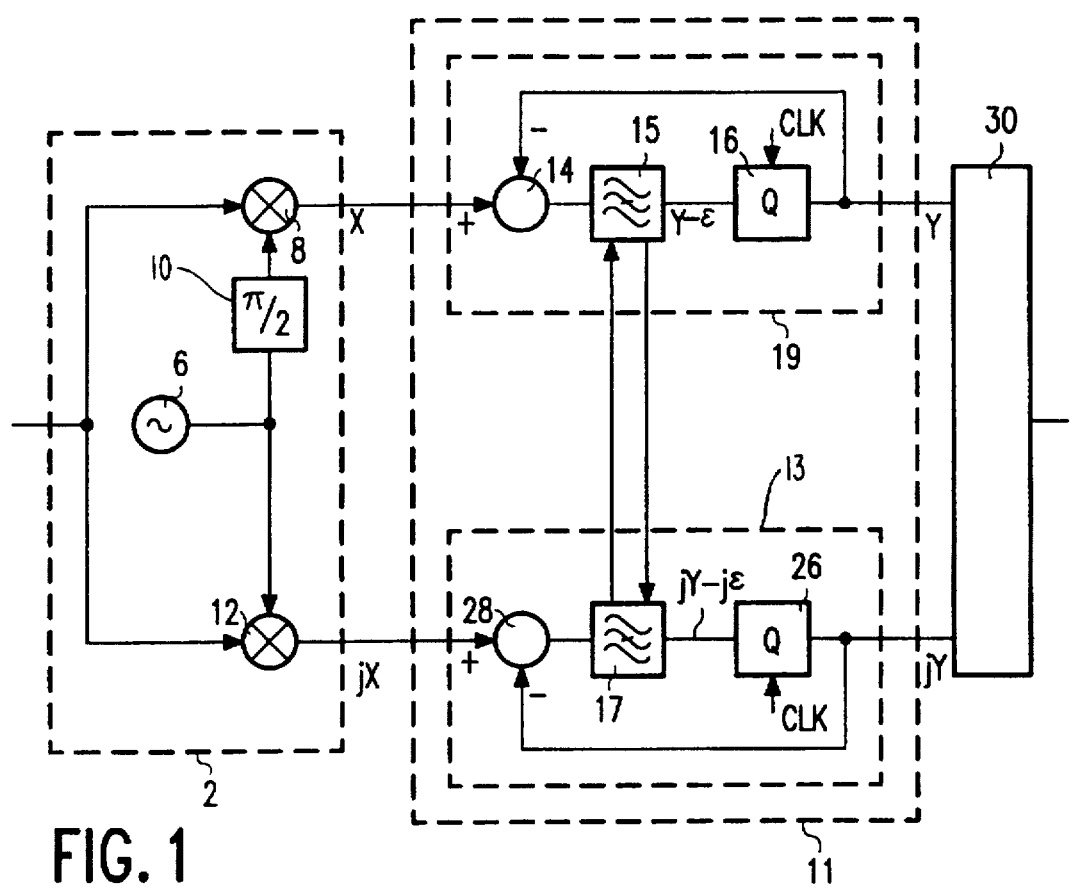
FIG. 1 is a receiver circuit constructed in accordance with the present invention.

In a receiver, generally indicated at 1 as shown in FIG. 1, a received signal is applied to an input of a phase shifter 2. The input of the phase shifter 2 is connected to a first input of a mixer 8, and to a first input of a mixer 12. An output of a local oscillator 6 is connected to a second input of the mixer 12 and to an input of a phase shifter 10. An output of the phase shifter 10 is connected to a second input of the mixer 8.

An output of the mixer 8, carrying the first signal X, is connected to a first input I of a conversion device 11, and an output of the mixer 12, carrying the second signal jX, is connected to an input Q of the conversion device 11. The first input I of the conversion device 11 is connected to an input of a first converter 19, being here an analog to digital converter. The second input Q of the conversion device 11 is connected to an input of a second converter 13, being here an analog to digital converter.

The input of the analog to digital converter 19 is connected to a first input of a combiner, such as a subtracter 14. The output of the subtracter 14 is connected to a first input of a filter 15. An output of the filter 15 is connected to an input of a quantiser 16. The output of the quantiser 16 is connected to a second input of the subtracter 14, and to a first output of the conversion device 11. The feedback signal in the first converter 19 is constituted by the output signal of the quantiser 16.

The input of the analog to digital converter 13 is connected to a first input of a combiner, such as a subtracter 28. The output of the subtracter 28 is connected to a first input of a filter 17. An output of the filter 17 is connected to an input of a quantiser 26. The output of the quantiser 26 is connected to a second input of the subtracter 28, and to a second output of the conversion device 11. The feedback signal in the second converter 13 is constituted by the output signal of the quantiser 26.

An internal signal of the filter 15 is connected to a second input of the filter 17 and an internal signal of the filter 17 is connected to a second input of the filter 15. The combination of the filters 15 and 17 is regarded as one single polyphase filter.

The first output of the conversion device 11 is connected to a first input of a digital signal processor 30, and the second output of the conversion device 11 is connected to a second input of the digital signal processor 30. The output of the digital signal processor 30 constitutes the output signal of the receiver 1.

The input of the receiver 1 of to FIG. 1 is converted into a first quadrature signal X and a second quadrature signal jX by the frequency converter means 2. This is done by mixing the input (received signal) with two quadrature local oscillator signals generated by the oscillator 6 and the phase shifter 10.

The signal X is converted into a one bit digital signal by the converter 19, which is constituted as a sigma delta modulator, and the signal jX is converted into a one bit digital signal by the converter 13, which is constituted as a sigma delta modulator. Due to the cross coupling between the filters 15 and 17 the quantisation noise reduction for a desired frequency can be improved without increasing the filter order. The signal derived from the output signal of the combiners 14 and 28 are here the internal signals of the filters 15 or 17 being coupled to the second input of the filter 17 and 15 respectively.

The transfer function of the signal converter 11 will now be derived. It is assumed that the (complex) transfer function of the polyphase filter constituted by the combination of the filters 15 and 17 is equal to $H_{pol}$. The polyphase input signal is represented by X, the polyphase output signal is represented by Y and the polyphase quantisation error is represented by $\epsilon$. Using this, for the relation between the input signal X and the output signal Y of the conversion device one can derive:

$$(X-Y)H_{pol}=Y-\epsilon \tag{1}$$

From (1) can be derived for Y:

$$Y = \frac{XH_{pol}}{1+H_{pol}} + \frac{\epsilon}{1+H_{pol}} \tag{2}$$

A polyphase filter can be modelled as a filter which derives its in-phase output signal from an addition of the in-phase input signal filtered according a transfer function $H_1$ and the quadrature input signal filtered according a transfer function $H_2$. The polyphase filter derives its quadrature signal from an addition of the quadrature input signal filtered according a transfer function $H_1$ and the in-phase input signal filtered according a transfer function $H_3$. In order to meet the polyphase requirement $H_2$ must be equal to $-H_3$. For such a polyphase filter can be derived for the transfer function $H_{pol}$:

$$H_{pol}(p)=H_1(p)-jH_3(p) \tag{3}$$

From (3) it can be seen that $H_{pol}(p)$ can be written as a polynomial with complex coefficients. This means that in general complex poles and complex zeros do not have to appear in complex conjugate pairs. Substituting (3) in (1) gives for Y:

$$Y = \frac{X(H_1-jH_3)}{1+H_1-jH_3} + \frac{\epsilon}{1+H_1-jH_3} \tag{4}$$

Figure 2:
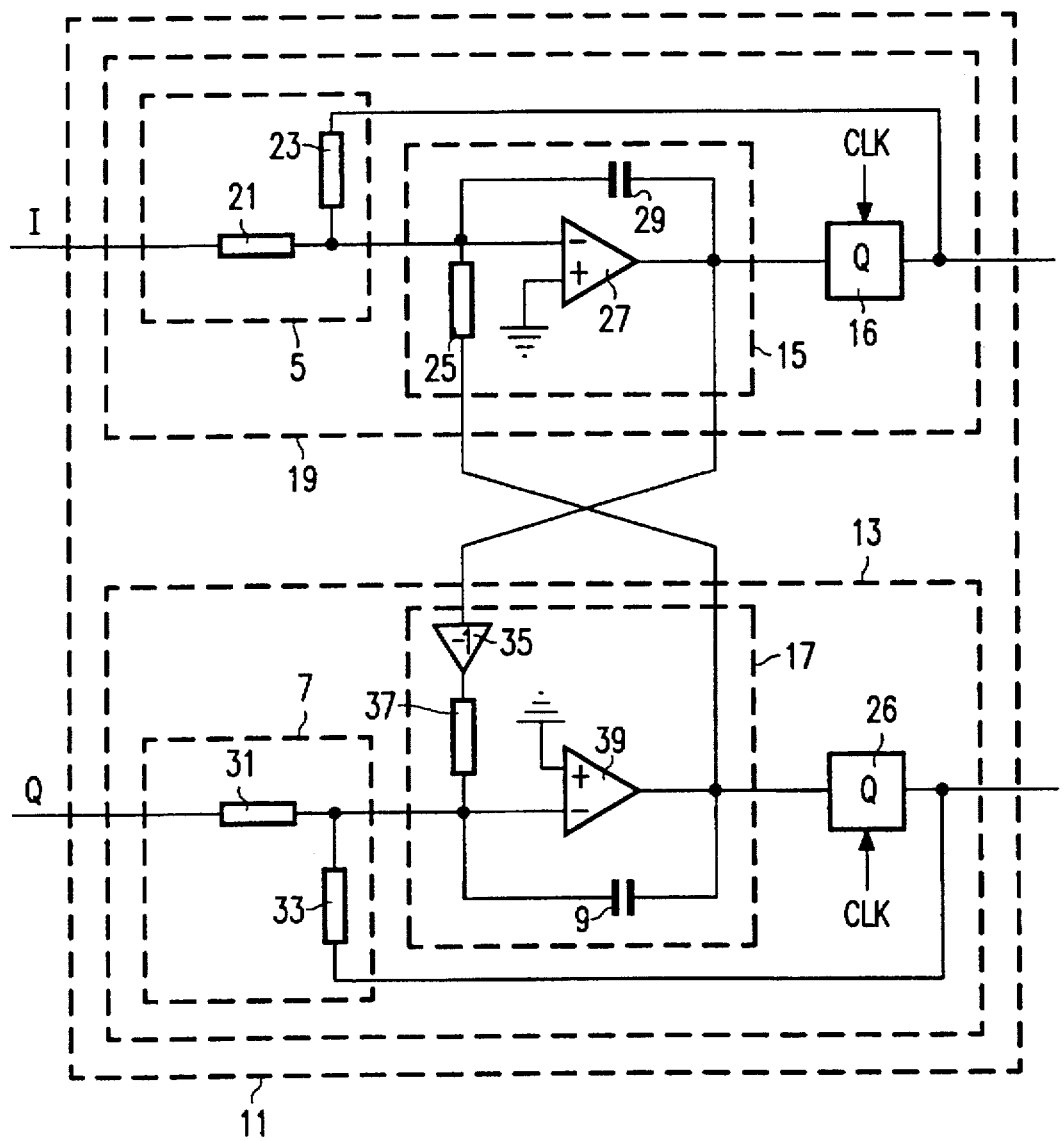
FIG. 2 is one embodiment of the signal converter circuit of FIG. 1.

In the signal converter 11 according to FIG. 2 the first input of an adder 5 is connected to a first terminal of a resistor 21. A second terminal of the resistor 21 is connected to a first terminal of a resistor 23 and to the output of the adder 5. A second input of the adder 5 is connected to a second terminal of the resistor 23.

The output of the adder 5 is connected to a first input of the filter 15. A first output of the filter 17 is connected to a second input of the filter 15. The first input of the filter 15 is connected to a first terminal of a resistor 25, an inverting input of an amplifier 27, and to a first terminal of a capacitor 29. A non-inverting input of the amplifier 27 is connected to a reference voltage, further to be referred to as ground. The second input of the filter 15 is connected to a second terminal of the resistor 25. The output of the amplifier 27 is connected to a second terminal of the capacitor 29 and to a first and a second output of the filter 15.

The second output of the filter 15 is connected to an input of the quantiser 16. The output of the quantiser is connected to the second input of the adder 5 and to the first output of the signal converter 11.

The first input of an adder 7 is connected to a first terminal of a resistor 31. A second terminal of a resistor 31 is connected to a first terminal of the resistor 33 and to the output of the adder 7. A second input of the adder 7 is connected to a second terminal of the resistor 33.

The output of the adder 7 is connected to a first input of the filter 17. A first output of the filter 15 is connected to a second input of the filter 17. The first input of the filter 17 is connected to a first terminal of a resistor 37, an inverting input of an amplifier 39, and to a first terminal of a capacitor 9. A non-inverting input of the amplifier 39 is connected to ground. The second input of the filter 17 is connected to an input of an inverter 35. The output of the inverter 35 is connected to a second terminal of the resistor 37. The output of the amplifier 39 is connected to a second terminal of the capacitor 9 and to a first and second output of the filter 17.

The second output of the filter 17 is connected to an input of the quantiser 26. The output of the quantiser 26 is connected to the second input of the adder 7 and to the second output of the signal converter 11. The adders 5 and 7 are performing a subtraction operation equivalent to that performed by the subtracters 14 and 28 by adding to the first input signal an inverted signal from the output of the quantisers 16 and 26 respectively. The inversion is caused by the amplifiers 27 and 39 in the filters 15 and 17, respectively. This addition is obtained by adding currents from the resistors 21 and 23. The required inversion is obtained due to the inverted output signal of the amplifier 39. The addition of the output signal of the filter 17 to the input of the filter 15 is done by adding the current from the resistor 25 to the currents from the resistors 21 and 23.

The polyphase filter used in FIG. 2 is somewhat different from the model explained when referring to FIG. 1. For this polyphase filter can be written:

$$O = \frac{-1}{pC} (R + jO \cdot G_2) \quad (5)$$

In (5) R is the current flowing into the filter 15, C is the value of the capacitors 29 and 9, O is the output voltage of the filter 15, and $G_2$ is the conductance of the resistors 25 and 37. The output voltage of the filter 17 can be written:

$$jO = \frac{-1}{pC} (-G_2 \cdot O + jR) \quad (6)$$

For the transfer function $H_{pol}$ is found:

$$H_{pol}(p) = \frac{-1}{pC + jG_2} \quad (7)$$

If it is assumed that the output stage of the quantiser produces pulses being $T_s/2$ delayed with respect to the clocking instant, the (time continuous) transfer function of the combination of polyphase filter and output stage of the quantiser can be written as:

$$H_t(p) = \frac{-G_1 e^{-p\frac{T_s}{2}}}{pC + jG_2} \quad (8)$$

In (8) is $T_s$ the sampling period of the quantiser, and is $G_1$ the conductivity of the resistors 21,23,31 and 33.

For the impulse response h(t) corresponding to $H_t(p)$ one can find:

$$h(t) = \begin{cases} 0; & t < \frac{T_s}{2} \\ \frac{G_1}{C} e^{-j\frac{G_2}{C}(t-\frac{T_s}{2})}; & t \geq \frac{T_s}{2} \end{cases} \quad (9)$$

Assuming a sampling period of $T_s$, one can find for the z transform corresponding to (9):

$$H_t(z) = \frac{G_1}{C} \cdot z^{-1} \frac{e^{-j\frac{G_2 \cdot T_s}{2C}}}{1 - z^{-1} \cdot e^{-j\frac{G_2 \cdot T_s}{C}}} \quad (10)$$

Now constants a and b are introduced according to:

$$a = \frac{G_1}{C} e^{-j\frac{G_2 \cdot T_s}{2C}} \quad (11)$$

$$b = e^{-j\frac{G_2 \cdot T_s}{C}} \quad (12)$$

Using (11) and (12) gives for (10):

$$H_t(z) = \frac{a \cdot z^{-1}}{1 - b \cdot z^{-1}} \quad (13)$$

For the noise transfer function in the z domain of the signal converter can be derived easily from (2):

$$\frac{Y(z)}{\epsilon(z)} = \frac{1}{H_t(z) + 1} = \frac{1 - bz^{-1}}{1 + (a - b)z^{-1}} \quad (14)$$

From (14) it is clear that the noise transfer function has a zero for z=b and a pole for z=b−a. b has an absolute value of 1, and consequently it lies on the unit circle. This results into an infinite suppression of quantisation noise for frequencies corresponding to b according to:

$$e^{-j\omega T_s} = b \quad (15)$$

In (15) $\omega_0$ is the angular frequency for which the quantisation noise suppression is infinite.

Figure 3:
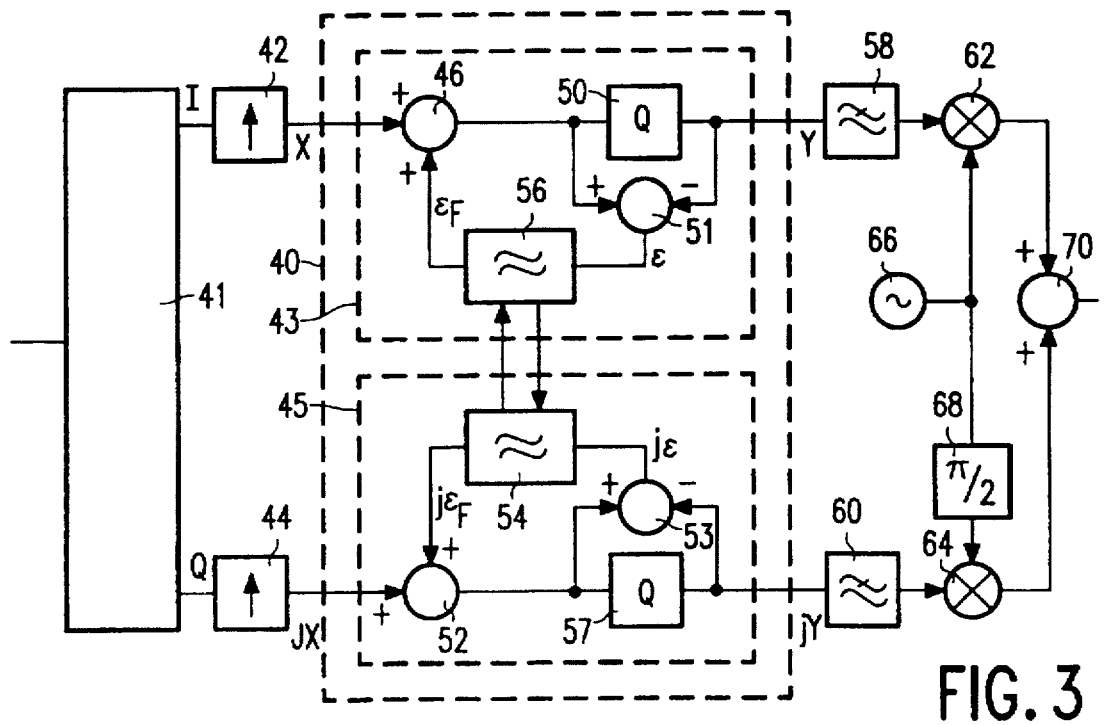
FIG. 3 is an embodiment of a transmitter circuit constructed in accordance with the present invention.

In a transmitter generally indicated at 100, as shown in FIG. 3, a digital signal to be transmitted is applied to a digital signal processor 41. A first output I of the digital signal processor 41 is connected to an input of a sample rate converter 42, and a second output Q of the digital signal processor 41 is connected to an input of a sample rate converter 44. The output of the sample rate converter 42 is connected to a first input of a conversion device 40, and the output of the sample rate converter 44 is connected to a second input of the conversion device 40.

The first input of the conversion device 40 is connected to an input of a first converter 43 and the second input of the conversion device 40 is connected to an input of a second converter 45. The input of the first converter 43 is connected to a first input of a combiner, such as an adder 46. An output of the adder 46 is connected to an input of a quantiser 50 and to a first input of a subtracter 51. The output of the quantiser 50 is connected to a second input of the subtracter 51 and to a first output of the conversion device 40. An output of the subtracter 51, carrying the error signal $\epsilon$, is connected to a first input of a filter 56. A first output of the filter 56, carrying output signal $\epsilon_F$, is connected to a second input of the adder 46. The signal $\epsilon_F$ is the feedback signal of the first converter 43. A second output of the filter 56 is connected to a first input of a filter 54.

The input of the second converter 45 is connected to a first input of a combiner, such as an adder 52. An output of the adder 52 is connected to an input of a quantiser 56 and to a first input of a subtracter 53. The output of the quantiser 57 is connected to a second input of the subtracter 53 and to a second output of the conversion device 40. An output of the subtracter 53, carrying the error signal jε, is connected to a second input of the filter 54. A first output of the filter 54, carrying output signal $j\epsilon_F$, is connected to a second input of the adder 52. The signal $j\epsilon_F$ is the feedback signal of the second converter 45. A second output of the filter 54 is connected to a second input of the filter 56.

The first output of the conversion device 40 is connected to an input of a low pass filter 58, and the second output of the conversion device 40 is connected to an input of a low pass filter 60. The output of the low pass filter 58 is connected to a first input of a mixer 62. An output of an oscillator 66 is connected to a second input of the mixer 62 and to an input of a phase shifter 68. The output of the low pass filter 60 is connected to a first input of a mixer 64. The output of the phase shifter 68 is connected to a second input of the mixer 64. An output of the mixer 62 is connected to a first input of a further combiner such as an adder 70. An output of the mixer 64 is connected to a second input of the adder 70. The output of the transmitter 100 is constituted by the output of the adder 70.

It is assumed that the digital signal processor generates a digital polyphase signal, being represented by the complex signals X(z) and jX(z). The sampling rate of the signals X(z) and jX(z) is increased by the sampling rate converters 42 and 44 respectively. This is done by adding samples with zero value between the input samples of the sampling rate converters 42 and 44 respectively.

For the output signals of the sampling rate converters 42 and 44 respectively can be written $X(z^N)=X(Z)$ and $jX(z^N)=jX(Z)$. N is the ratio between the sampling rate at the input and the output of the sampling rate converters 42 and 44.

The conversion devices 43 and 45 are constituted as noise shaper. It means that the quantisation error made by the quantiser is fed back to the adder at the input of the respective conversion device. By filtering the error signal before applying it to the adder 46 or 52 respectively, a frequency dependent suppression of quantisation noise in the output signal of the corresponding quantiser is obtained, as will be shown below. The error signal ε is regarded as a polyphase signal, so the output signal of the subtracter 51 is equal to ε and the output signal of the subtracter 53 is equal to jε. The filters 54 and 56 constitute together a polyphase filter with a polyphase output signal $\epsilon_F$. The signal at the input of the second input of the subtracter 46 is equal to $\epsilon_F$ and the signal at the input of the subtracter 52 is equal to $j\epsilon_F$. The signal derived from the output signal of the combiners is here the error signal.

The polyphase output signal of the signal converter can be found to be:

$$Y(Z)+\epsilon(Z)=X(Z)+H_{pol}(Z)\cdot\epsilon(Z) \quad (16)$$

From (16) can be found for Y(Z):

$$Y(Z)=X(Z)+\epsilon(Z)\cdot[H_{pol}(Z)-1] \quad (17)$$

From (17) it can be seen that the signal Y(Z) is equal to the sum of the input signal X(Z) and a filtered error signal. For the quantisation noise transfer function Y(Z)/ε(Z) is found:

$$\frac{Y(Z)}{\epsilon(Z)}=H_{pol}(Z)-1 \quad (18)$$

It is assumed that $H_4(Z)$ is the transfer function from the first input of the filters 54 and 56 respectively to the corresponding output of the filters 54 and 56, $H_5(Z)$ is the transfer function from the second input of the filter 54 to the output of the filter 54, and $H_6(Z)$ is the transfer function from the second input of the filter 56 to the output of the filter 56. In order to meet the polyphase requirements $H_5$ must be equal to $-H_6$. The transfer function $H_{pol}(Z)$ of the polyphase filter constituted by the combination of the filters 54 and 56 is equal to $H_4(Z)+jH_6(Z)$. If it is assumed that at least one delay $Z^{-1}$ is present in the loop, and if first order feedback filters are used, $H_4(Z)$ and $H_6(Z)$ can be written in general terms as:

$$H_4(Z)=Z^{-1}(AZ^{-1}+B) \quad (19)$$

$$H_6(Z)=Z^{-1}(CZ^{-1}+D) \quad (20)$$

In (19) and (20) A,B,C and D are constants. For the noise transfer function can now be found:

$$\frac{Y(Z)}{\epsilon(Z)}=\frac{Z^2-(B-jD)\cdot Z+(-A+jC)}{Z^2} \quad (21)$$

This noise transfer function shows two poles at the origin at two (in general) complex zeros which do not have to be conjugate to each other. Preferably both zeros are positioned at the unit circle, resulting in a high noise suppression for frequencies corresponding to said zeros. Due to the possibility of locating both zeros at one side of the real axis an increased noise suppression can be obtained at a limited filter order.

The output signals of the quantisers 50 and 57 are applied to the analog band pass filters 58 and 60, respectively. It is observed that the output signals of the quantisers 50 and 57 are electrical signals which can assume a value corresponding to the value of the quantised signal. Application of two-level quantisers 50 and 57 has the advantage that an analog signal can be derived by filtering the output signals of the quantisers 50 and 57 by means of said analog filters 58 and 60. The pass band of the band pass filters 58 and 60 is chosen to be in the frequency range where a large noise suppression is obtained. The output signals of the filters 58 and 60 then can be regarded as real and imaginary part of a complex signal Y'. The output signals of the filter 58 is multiplied by the output signal of the oscillator 66, and the output signal of the filter 60 is multiplied by the output signal of the oscillator 66 shifted by π/2. If the output signal of the oscillator 66 is equal to $\cos(\omega_0 t)$, the output signal of the phase shifter 68 is equal to $\sin(\omega_0 t)$. The output signal of the mixer 62 is equal to $\Re\{Y'\}\cdot\cos(\omega_0 t)$, and the output signal of the mixer 64 is equal to $\Im\{Y'\}\cdot\sin(\omega_0 t)$. For the output signal of the adder 70 is found:

$$U=\Re\{Y'\}\cdot\cos(\omega_0 t)+\Im\{Y'\}\cdot\sin(\omega_0 t) \quad (22)$$

(22) can be written as:

$$U=\frac{(\Re\{Y'\}-j\Im\{Y'\})e^{j\omega_0 t}+(\Re\{Y'\}+j\Im\{Y'\})e^{-j\omega_0 t}}{2} \quad (23)$$

(23) can also be expressed as:

$$U=\frac{Y'^*e^{j\omega_0 t}+Y'e^{-j\omega_0 t}}{2} \quad (24)$$

If for example Y' is equal to $e^{-j\omega_1 t}$, for U can be derived:

$$U=\frac{e^{j\omega_1 t}e^{j\omega_0 t}+e^{-j\omega_1 t}e^{-j\omega_0 t}}{2}=\cos((\omega_1+\omega_0)t) \quad (25)$$

From (25) can be seen that the signal at the outputs of the filters 58 and 60 is modulated on a carrier with angular frequency $\omega_1$.

Figure 4:
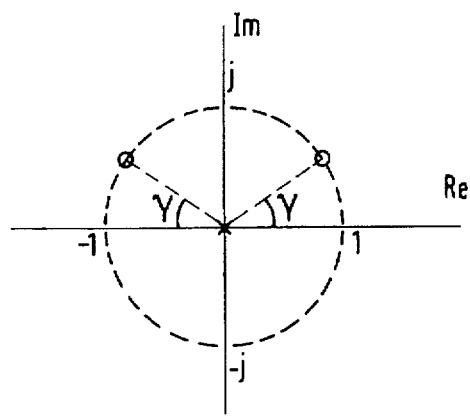
FIG. 4 is a pole-zero plot of the quantisation noise transfer function of the digital to analog converter in the transmitter of FIG. 3.

In the pole zero plot according to FIG. 4 the poles and zeros of the noise transfer function of the conversion device 40 are plotted for a particular choice of the transfer functions $H_4(Z)$ and $H_6(Z)$. $H_4(Z)$ was chosen to be equal to $Z^{-2}$, and $H_6(Z)$ was chosen to be equal to $2 \cdot \sin \gamma$. This choice results in a double pole at the origin, and two zeros on the unity circle at an angle $\gamma$ with the positive and negative real axis respectively. This will result in a complete suppression of the quantisation noise at frequencies corresponding to the zeros.

Figure 5:
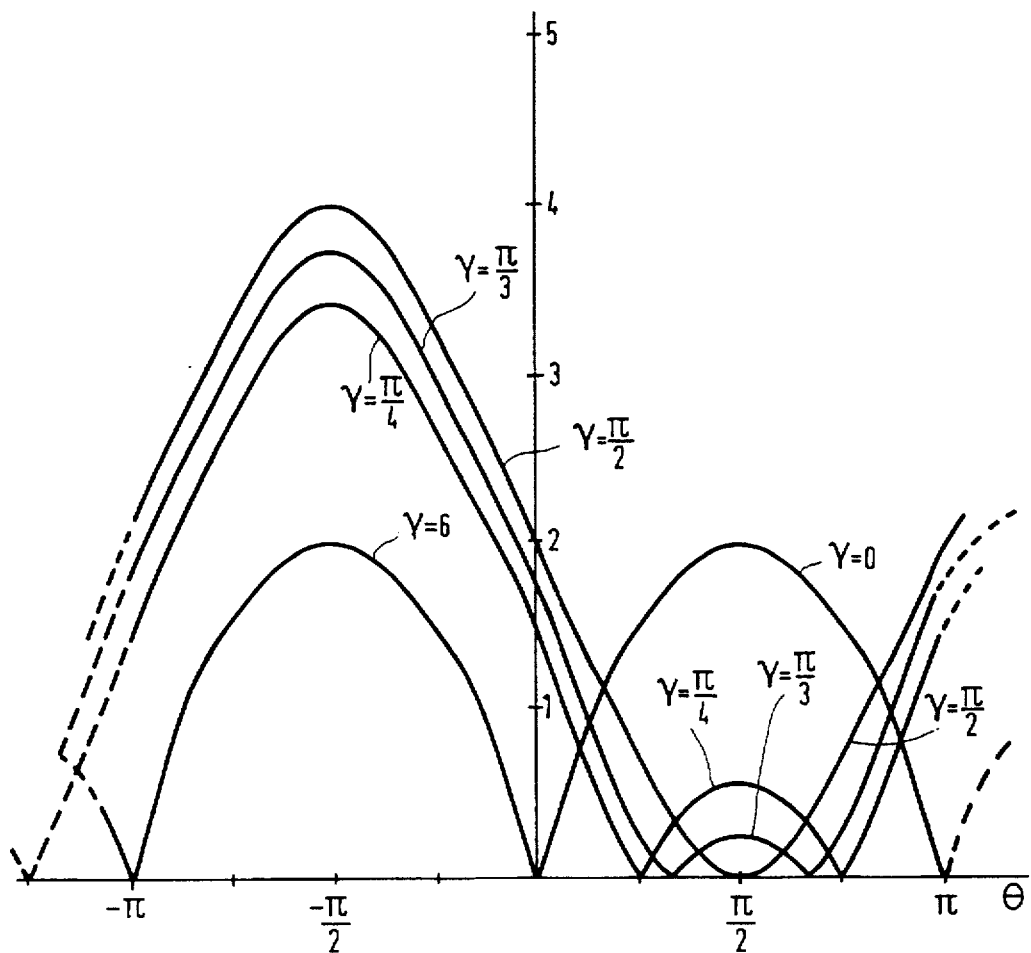
FIG. 5 is a graph of the absolute value of the quantisation noise transfer function of the digital to analog converter in the transmitter of FIG. 3.

In FIG. 5 the absolute value of the noise transfer function is plotted as function of the relative frequency $\theta=2\pi f/f_s$ in the fundamental interval from $-\pi$ to $\pi$ for different values of $\gamma$. f is the actual frequency considered, and For $\gamma=0$, both zeros lie on the real axis, and this results on a quantisation noise transfer function being 0 for $\theta=0$. For $\gamma=\pi/2$, both zeros are equal to $+j$, resulting in a noise transfer function being 0 for $\theta=\pi/2$. For $\gamma=\pi/4$, the noise transfer function is equal to 0 for $\theta=\pi/4$ and for $\theta=\pi/4$. For $\gamma=\pi/3$, the noise transfer function is equal to 0 for $\theta=\pi/3$ and for $\theta=\pi/3$. In contradistinction to the situation for $\theta=0$ (prior art) the noise transfer function is smaller for positive values of $\theta$ in comparison to negative values of $\theta$.

I claim:

1. A receiver comprising a phase shifter for deriving from an input signal at least a first signal and a second signal having a predetermined phase relationship; a first converter for converting the first signal into a first converted signal, said first converter including a first combiner for combining the signal to be converted and a feedback signal and a first cascade arrangement of a first filter and a first quantiser to derive the feedback signal from the output signal of the first combiner; a second converter for converting the second signal into a second converted signal, the second converter including a second combiner for combining the signal to be converted and a feedback signal and a second cascade arrangement of a second filter and a second quantiser to derive the feedback signal from the output signal of the second combiner; and a coupler for applying a signal derived from the output signal of the first combiner to the second filter in the second converter and for applying a signal derived from the output signal of the second combiner to the first filter in the first converter.

2. The receiver according to claim 1, wherein at least one of the first and second cascade arrangement comprises at least the filter followed by the quantiser.

3. The receiver according to claim 1, wherein at least one of the first and second cascade arrangement comprises at least the quantiser followed by the filter.

4. The receiver according to claim 3, wherein the first and second converter comprise means for deriving an error signal representative of the difference between the input signal of the quantiser and the output signal of the quantiser, the input signal of the filter being representative of the error signal.

5. The receiver as claimed in claim 1, wherein the coupler includes a first coupler circuit for applying a signal derived from the output signal of the first combiner in the first converter to the second filter in the second converter and a second coupler circuit for applying a signal derived from the output signal of the second combiner in the second converter to the first filter in the first converter.

6. A transmitter for deriving a signal to be transmitted from at least a first signal and a second signal having a predetermined phase relationship, said transmitter comprising a first converter for converting the first signal into a first converted signal, the first converter including a first combiner for combining the signal to be converted and a feedback signal and a first cascade arrangement of a first filter and a first quantiser to derive the feedback signal from the output signal of the first combiner; a second converter for converting the second signal into a second converted signal, the second converter including a second combiner for combining the signal to be converted and a feedback signal and a second cascade arrangement of a second filter and a second quantiser to derive the feedback signal from the output signal of the second combiner; a coupler for applying a signal derived from the output signal of the first combiner to the second filter in the second converter and for applying a signal derived from the output signal of the second combiner in the second converter to the first filter in the first converter; and a third combiner for combining the first converted signal and the second converted signal into a combined signal.

7. The transmitter according to claim 6, wherein at least one of the first and second cascade arrangement comprises at least the filter followed by the quantiser.

8. The transmitter according to claim 6, wherein at least one of the first and second cascade arrangement comprises at least the quantiser followed by the filter.

9. The transmitter according to claim 8, wherein the first and second converter comprise means for deriving an error signal representative of the difference between the input signal of the quantiser and the output signal of the quantiser, the input signal of the filter being representative of the error signal.

10. The transmitter as claimed in claim 6, wherein the coupler includes a first coupler circuit for applying a signal derived from the output signal of the first combiner in the first converter to the second filter in the second converter and a second coupler circuit for applying a signal derived from the output signal of the second combiner in the second converter to the first filter in the first converter.

11. A signal conversion device for converting a first signal and a second signal having a predetermined phase relationship with respect to the first signal, said device comprising a first converter for converting the first signal into a first converted signal, the first converter including a first combiner for combining the signal to be converted and a feedback signal and a first cascade arrangement of a first filter and a first quantiser to derive the feedback signal from the output signal of the first combiner; a second converter for converting the second signal into a second converted signal, the second converter including a second combiner for combining the signal to be converted and a feedback signal and a second cascade arrangement of a second filter and a second quantiser to derive the feedback signal from the output signal of the second combiner; a coupler for applying a signal derived from the output signal of the first combiner to the second filter in the second converter and for applying a signal derived from the output signal of the second combiner to the first filter in the first converter.

12. The signal conversion device according to claim 11, wherein at least one of the first and second cascade arrangement comprises at lest the filter followed by the quantiser.

* * * * *